United States Patent [19]

Pollara-Bozzola

[11] Patent Number: 4,868,830

[45] Date of Patent: Sep. 19, 1989

[54] METHOD AND APPARATUS FOR IMPLEMENTING A TRACEBACK MAXIMUM-LIKELIHOOD DECODER IN A HYPERCUBE NETWORK

[75] Inventor: Fabrizio Pollara-Bozzola, Los Angeles, Calif.

[73] Assignee: California Institute of Technology, Pasadena, Calif.

[21] Appl. No.: 86,710

[22] Filed: Aug. 18, 1987

Related U.S. Application Data

[63] Continuation-in-part of Ser. No. 781,224, Sep. 27, 1985, Pat. No. 4,730,322.

[51] Int. Cl.[4] .............................................. G06F 11/10
[52] U.S. Cl. ..................................................... 371/43
[58] Field of Search ....................... 371/43, 37, 44, 38, 371/45, 39, 40; 364/200, 900

[56] References Cited

U.S. PATENT DOCUMENTS

| | | | |
|---|---|---|---|
| 4,015,238 | 3/1977 | Davis | 371/43 |
| 4,247,892 | 1/1981 | Lawrence | 364/200 |
| 4,493,082 | 1/1985 | Cumberton | 371/43 |
| 4,500,994 | 2/1985 | McCallister | 371/43 |
| 4,545,054 | 10/1985 | Davis | 371/43 |
| 4,730,322 | 3/1988 | Pollard-Bozzola | 371/43 |

Primary Examiner—Michael R. Fleming
Attorney, Agent, or Firm—Jackson & Jones

[57] ABSTRACT

A method and a structure to implement maximum-likelihood decoding of convolutional codes on a network of microprocessors interconnected as an n-dimensional cube (hypercube). By proper reordering of states in the decoder, only communication between adjacent processors is required. Communication time is limited to that required for communication only of the accumulated metrics and not the survivor parameters of a Viterbi decoding algorithm. The survivor parameters are stored at a local processor's memory and a traceback method is employed to ascertain the decoding result. Faster and more efficient operation is enabled, and decoding of large constraint length codes is feasible using standard VLSI technology.

18 Claims, 8 Drawing Sheets

FIG. 8a 00   11   10   11   11   01   ---
RECEIVED SEQUENCE 0    1    0    0    1    1   ---
DECODED SEQUENCE

METHOD AND APPARATUS FOR IMPLEMENTING A TRACEBACK MAXIMUM-LIKELIHOOD DECODER IN A HYPERCUBE NETWORK

BACKGROUND OF THE INVENTION

The invention described herein was made in the performance of work under a NASA Contract and is subject to the provisions of Public Law 96-517 (35 USC 202) in which the contractor has elected not to retain title.

1. Origin of the Invention

This application is a continuation-in-part of an application entitled "Method and Apparatus for Implementing a Maximum-Likelihood Decoder in a Hypercube Network", filed on Sept. 27, 1985, Ser. No. 781,224, now issued as U.S. Pat. No. 4,730,322, and assigned to the same assignee.

2. Field of the Invention

The present invention is concerned with a method for maximum-likelihood decoding of convolutional codes on a network of microprocessors, and apparatus for executing this method.

3. Brief Description of the Prior Art

A concurrent computing system in which individual computers, each with a computational processor and a message-handling processor, are connected as a hypercube is described and claimed in an application entitled "Concurrent Computing System Through Asynchronous Communication Channels," Ser. No. 754,828, filed on July 12, 1985 and assigned to California Institute of Technology. As there described, N nodes (numbered 0, 1, ... N−1) are connected together in a binary (or Boolean) n-dimensional cube in which $N=2^n$ or $n=\log_2 N$. The above-identified application depicts one representative hypercube connection of a network of processors in which the processors are located at the vertices of an n-dimensional cube and communicate with each other by bidirectional communication links only along the edges of the cube. One manner of transmitting data and representative examples of microprocessor hardware and software suitable for performing the data transfer feature of this invention is fully disclosed in the above-identified application.

Maximum-likelihood decoding of convolutional codes is also well known. The Viterbi decoding algorithm is commonly used for such decoding, and many textbooks such as "Theory and Practice of Error Control Codes" by Richard E. Blahut, Copyright 1983 by Addison-Wesley publishing Company, Inc. describe the encoding/decoding of convolutional codes. A Viterbi decoding algorithm is conceptualized in the text and a succinct summary of a trellis diagram, stages, states and common steps to obtain accumulated metrics and survivors is described at pages 350 through 353 and 377 through 382 of the text.

Convolutional codes are widely used in digital communcation systems to decrease the probability of error on a given noisy channel (coding gain). They are characterized by the constraint length K and by the code rate given by the ratio $k_0/n_0$, where $n_0$ channel symbols are generated by the encoder for each $k_O$ input data bit. Details can be found, for example, in the above-noted "Theory and Practice of Error Control Codes," by R. E. Blahut.

Convolutional codes can achieve large coding gain if they use large memory m, or equivalently, large constraint length $K=M+k_0$. An encoder for such codes is a finite-state machine with $2^m$ states. The complexity of a maximum-likelihood decoder is approximately proportional to the number of states, i.e., it grows exponentially with m.

The task of the decoder is to consider all possible paths on a trellis of about 5m stages, and find the most likely path, according to a specified goodness criterion. The goodness criterion is described in the article "The Viterbi Algorithm," by G. D. Forney, Proc. IEEE, Vol. 61 (1973), pp. 263-278.

The storage and update of hypothesized information sequences (survivors) is performed by using a parallel version of the trace-back method, described in the textbook "Error-Correction for Digital Communications," by G. C. Clark and J. B. Cain, ©1981, Plenum Press.

SUMMARY OF THE INVENTION

Multiprocessor systems have the potential to obtain large computation power. This is possible if one can solve the problem of how to decompose the decoding algorithm. There are two key requirements in the problem decomposition: (1) divide the algorithm in equal parts, in order to share equally the resources available in each processor, and (2) minimize the communication between the parts, so that each processor needs to share information only with nearest neighbors.

Since a single microprocessor or VLSI chip cannot accommodate all the functions required to implement complex decoders, methods must be found to efficiently use a network of processors. Parallel decoding is accomplished by a network of processors with each processor connected as the edges of an n-dimensional cube.

The most basic embodiment assigns each available processor to each single state of the decoder. The proper reordering of paths and states is obtained by making a given processor x act as state $\hat{x}$, where $\hat{x}$ is a function of x and the stage of the trellis, based on cyclic shifts of the binary label representing x.

The method also provides a way to group sets of $s=2^s$ states into each processor still requiring only communication between neighboring processors. This arrangement yields high computational efficiency for complex codes. The arrangement can accommodate different numbers $S=S^s$ of the $M=2^m$ decoder status into each processor, depending on the code complexity and the number of available processors $N=2^m$, where $M=S \times N$.

In the aforementioned parent application, now issued as U.S. Pat. No. 4,730,322, each processor on the cube is in direct communiction with n neighbors. Each dimension of the cube corresponds to a stage on an n-cube equivalent trellis, and those direct communication paths are shown on the equivalent trellis. Each given processor represents one or more trellis states in accordance with a state-order formula of the invention. Decoding in the parent is provided by transmitting/receiving decoding parameters including both accumulated metrics and survivors along the n-cube communication paths. The amount of information required to communicate survivors between neighbors is several times, in relative terms, that required for transmitting/receiving the accumulated metrics. This continuation-in-part application reduces the communication time between neighboring processors because only the accumulated metrics need be communicated with neighbors. The decoding is performed by tracing-back paths on the cube.

Each processor receives from neighboring processors the goodness measure (accumulated metric) associated with paths previously examined in such processors, adds the goodness measure for the current branch (branch metric), and then stores, in its local memory, the result of the comparison between the goodness of paths under consideration. This stored information is then used to trace-back the most likely path and finally to compute the decoded incoming symbols.

The method of this continuation-in-part application reduces the communication requirements betweeen processors, by eliminating the need for exchanging survivors. Reduced communication requirements enhances efficiency.

FEATURES OF THE INVENTION

It is a feature of the invention to provide a method and apparatus for maximum-likelihood decoding of convolutional codes on a network of microprocessors interconnected as a n-dimensional cube and having each processor compute its own local portion of the goodness criteria, so that ultimately all paths of a trellis diagram in parallel with concurrent computations being achieved by other processors in the cube are determined. This feature results in high efficiency, in terms of decoding speed, and allows use or codes more complex than those presently decodable with known methods.

In accordance with the present invention, a method is provided for decoding convolutional codes, by the accumulated metric and survivor steps of the known Viterbi algorithm, but with the novel and unique difference that decoding operations are performed in parallel by a network of processors placed at the vertices of an n-dimensional cube, and bidirectionally communicating with neighboring processors only along the edges of the cube. This decoding method can operate with high efficiency because the parallel decoding operations concerning each state of the decoder are performed in a suitable and novel order within each processor.

Further provided in accordance with this invention is an arrangement for implementing a novel method, comprising a decoder structure which is characterized by:

(1) input means for sending the received channel symbol sequence to all processors in the network;

(2) output means for delivering the decoded, most likely, data sequence to a user;

(3) a network of $N=2^n$ processors interconnected as an n-dimensional cube, having bidirectional communication along the edges of the cube for receiving/transmitting to neighboring processors accumulated metrics only;

(4) an equivalent trellis which has stages matching the n-dimensions of the n-cube, with the processors representing different states in the equivalent trellis; and (5) means in each processor to internally perform comparisons between accumulated metrics, and to store the results of such comparisons for trace-back decoding.

BRIEF DESCRIPTION OF THE DRAWINGS

The trellis can be extended by repeating the m stages shown, to form a periodic structure;

FIG. 6, including FIGS. 6a, 6b, and 6c, contains the arrangements for decoders with M=8 states and S=1, 2, or 4 states per processor respectively;

DETAILED DESCRIPTION OF THE DRAWINGS

Convolutional codes are well known. Such codes can achieve large coding gain, i.e., improvement on the overall performance of a digital communication link, if they use large memory m, or equivalently, large constraint length $K=m+1$ (in the simple case when $k_o=1$). An encoder for such codes is a finite-state machine with $2^m$ states. Decoders for convolutional codes can be effectively described in terms of a graph called a trellis diagram, as shown in FIG. 1 for an m=3, 8-state code.

Figure 1:
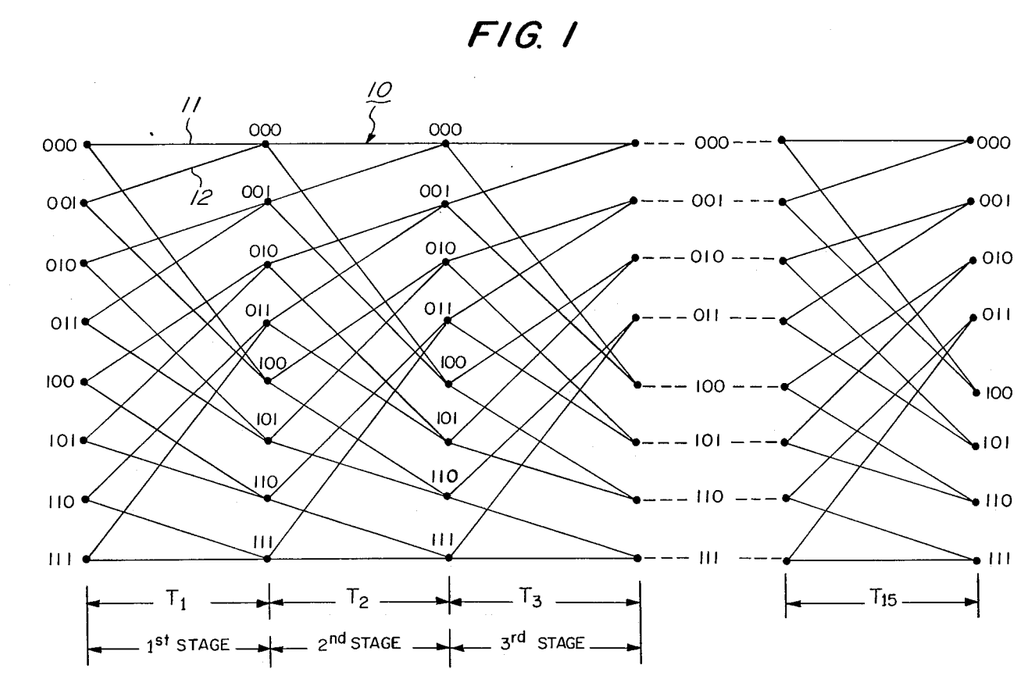
FIG. 1 is a trellis diagram of the Viterbi algorithm, showing all the possible state transitions for an 8-state decoder ($M=2^m=8, m=3$). Only four stages are shown, but the trellis can be extended as necessary.

The left-hand column of FIG. 1 shows all of the possibilities for a three-bit grouping in a finite state coding machine of three shift register cells, or memory m=3. In keeping with the Viterbi decoding algorithm, a decoder would examine all eight possibilities by using an iterative trial. Each iteration corresponds to a separate vertical column such as iteration No. 1, No. 2, etc. through 15. The number of iterations in a time sequence, with time being depicted horizontally, is shown in FIG. 1 for 15 iterations. It is a rule of thumb that 15=5m iterations will almost always yield the proper result. Obviously more iterations can be tried, but the extra number of iterations normally does not achieve any significantly-improved results.

The task of the decoder is to consider all possible paths on a trellis of about 5m stages, and find the most likely path, according to a specified goodness criterion. The goodness criterion is simply a number of merit which will be explained in more detail hereinafter for a typical simplified example of FIG. 8. Suffice it to say at this point that a received sequence of symbols is viewed by the decoder as simply a trial of hypothesized sequences. As each new received symbol is considered, the weighted values of trellis paths are reviewed by the decoding algorithm and the lowest number (indicating the highest level of goodness) is temporarily chosen as the best possible candidate to match the one that was originally encoded.

The trellis diagram 10 in FIG. 1 is used in the Viterbi algorithm to represent all possible transitions between states as described in the above-mentioned articles. In particular, at each stage all eight states are examined and only one of the two possible paths 11, 12 coming into a state (such as 000) is preserved, along with its goodness or likelihood measure, called an accumulated metric. At a given time (stage), such as Time $T_1$, each state is associated with one (and only one) path (path 12, for example) reaching it. The algorithm performs the following steps:

(1) Update the value of the accumulated metric of the two paths converging into each state, according to a known rule. This known rule, described in detail in the above-referenced paper by Forney consists, in summary, of adding the so-called branch metric, which depends on the received symbol, to the accumulated metrics of the paths converging into each state;

(2) Choose the preferred path between those two by comparing their metrics; and (3) Store the result of said comparison and the metric of the chosen path.

Figure 3:
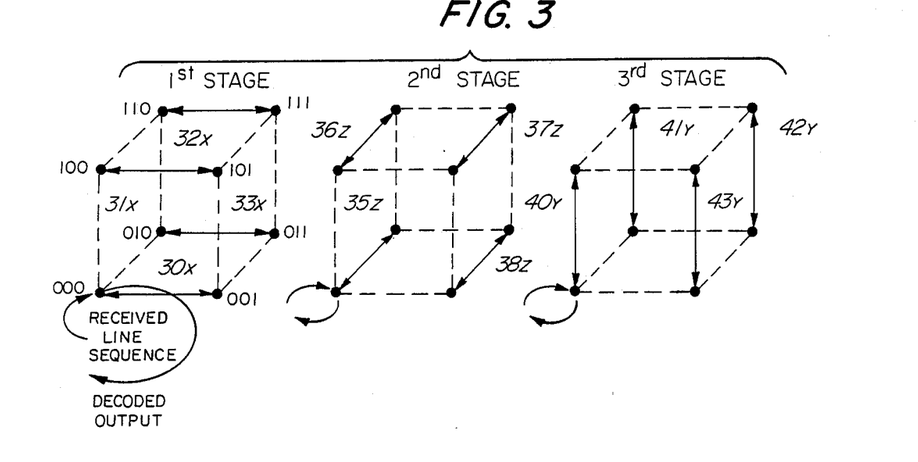
FIG. 3 is an example of an n-dimensional cube (n=3) network of microprocessors placed at the vertices of the cube, where solid lines show connections used in a given stage.

Before describing the trellis for the processor/decoder method and apparatus of this invention, a brief review of the simplified diagram of FIG. 3 is believed helpful. The earlier-identified application discloses a complete concurrent processing system in which bidirectional communication links transmit data along the edges of a cube. For simplicity sake each node, or processor, is shown simply as a dot. In FIG. 3, the bidirectional communication links are shown as solid lines with double-headed arrows $30_x$ through $33_x$, $35_z$ through $38_z$ and $40_y$ through $43_y$, respectively. The letters x, y and z indicate directions of communication in the cube. Associated with the corner locations of the cube network are binary labels which identify the processors. For example, processor $P_O$ is identified by the tribit group 000, $P_1$ by the tribit group 001, etc. Each processor $P_{000}$ ($P_0$) through $P_{111}$ ($P_7$) is directly connected only to its n neighbors.

It is desirable to use direct communication links between processors, in order to speed up communication. Bidirectional link $3O_x$ delivers bit sequences back and forth between processors $P_0$ and $P_1$ in any well known manner. Likewise, as shown, link $31_x$ is connected between $P_4$ and $P_5$, link $32_x$ is connected between $P_6$ and $P_7$, and link $33_x$ is connected between $P_2$ and $P_3$. In the second stage of FIG. 3, bidirectional link $35_z$ is connectd between processors $P_0$ and $P_2$. link $36_z$ is connected between $P_4$ and $P_6$, etc. as is there depicted.

Since complex codes have a very large number of states, it becomes impossible to perform sequentially all the above steps in reasonable time with a single processor. It is therefore desirable to share the work-load among many processors working in parallel.

Processors must be able to communicate among themselves in order to exchange intermediate results. Therefore, the decoding process will include some time spent in computation internal to each processor, and some time for interprocessor communication. It is this latter communication time which must be kept as small as possible to yield decoding efficiency.

The advantage which can be achieved by the invention is the ability to use large constraint length convolutional codes, which yield high coding gain and to keep acceptable decoding speed with feasible hardware.

This is due to the fact that the efficiency of the method, given by $$n = \frac{N_0 t_0}{N_0 t_0 + N_t t_t} = \frac{\text{sequential alg. time}}{N \times (\text{parallel alg. time})}$$

Where $N_o$ is the number of parallel metric comparisons, $t_o$ is the comparison time, $N_t$ is the number of parallel metric exchanges, and $t_t$ is the exchange time, which time remains high even when a large number of processors are used.

While $t_o$ and $t_t$ depend on the hardware for the processors, the method yields technology used for the processors, the method yields $$N_t = S(m - s) = \frac{M_n}{N}$$

$$N_0 = Sm = \frac{M_n}{N}$$

so that the efficiency is always above the ratio $$\frac{t_0}{t_0 + t_t}$$

which is reached when N=M.

We assign each state of FIG. 1 to a different processor, so that all operations concerning all states can be done simultaneously (in parallel) at each stage, and sequentially stage by stage. Upon examination, however, I discovered that if we assign state 0 to processor $P_0$, state 1 to processor $P_1$, and so on up to state N−1 to processor $P_{N-1}$ ($P_7$) and we consider processors connected as in FIG. 3, then links between processors which are not directly connected in FIG. 3 would be necessary to implement all links between the states or processors in FIG. 1. My novel solution included mapping the states in the trellis 10 of FIG. 1 as the hypercube trellis 20 of FIG. 2.

Figure 2:
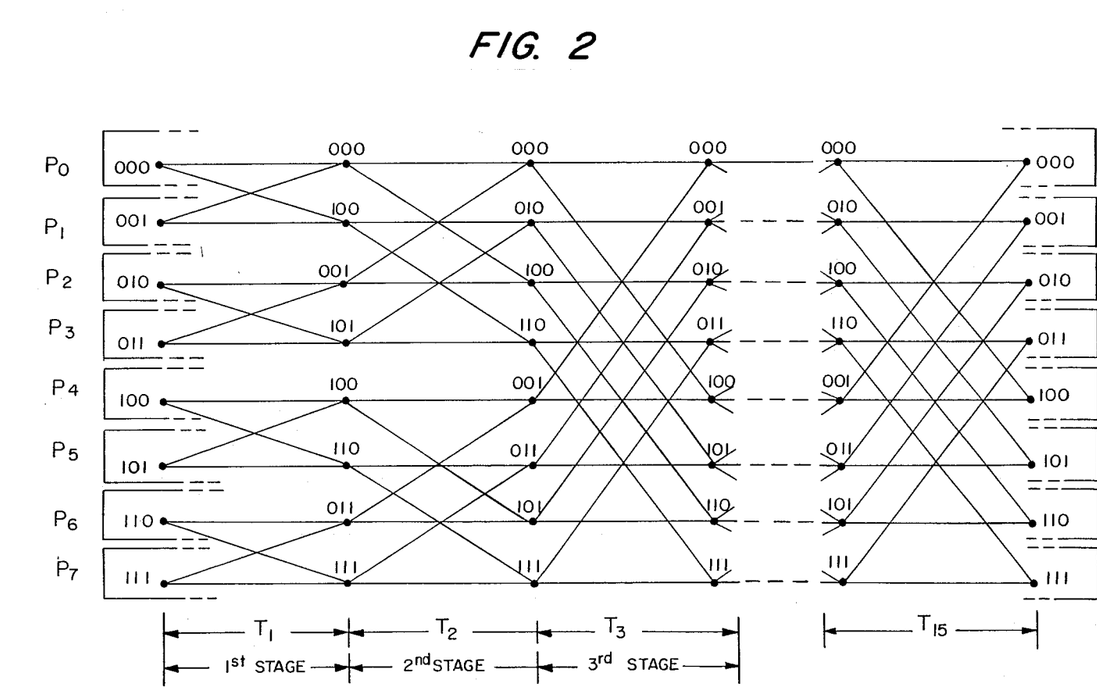
FIG. 2 is the hypercube trellis diagram of this invention showing transitions between processors $P_i$ of the hypercube and the states represented by each processor.

According to the principles of my invention, a given processor is not assigned to a fixed state, as was the case in FIG. 1. Instead, for my invention the processors are identified by a binary lable ($P_0=P_{000}$, $P_1=P_{001}$, etc.) as shown in FIG. 2, and the trellis labelling and stage order is uniquely defined by the formula to be described. In particular, processor x represents state $\hat{x}$ at stage k, if $$\hat{x} = \rho^{(k)}(x),$$

where $\rho^{(k)}(.)$ is the cyclic right shift of x by k binary positions. A path through given states in FIG. 1 is thus represented by a specified equivalent path in FIG. 2, which passes through the same states. This means that there is a well-defined correspondence between paths in FIGS. 1 and 2. According to this correspondence, a Viterbi-type algorithm, based on the trellis of FIG. 1, can be performed on the hypercube trellis of FIG. 2.

The interesting and useful property of the trellis diagram of FIG. 2 is that all the required links between processors are now exactly those available in the hypercube network of FIG. 3. The first stage labeled as such in FIG. 3 shows how the first stage of FIG. 2 can be performed by using the connections $30_x$ through $33_x$ (marked with solid lines and double-headed arrows) between processors $P_0$, $P_1$ and $P_2$, $P_3$ and $P_4$, $P_5$ and $P_6$, $P_7$, respectively. Similarly, the second and third stages of FIG. 3 show the bidirectional communication links required for implementation of the second and third stages of FIG. 2. It should be understood that the embodiment of the decoder on the network has been explained for the case m=3, but it clearly can be generalized to other decoder sizes and hypercube dimensionality.

Figure 4:
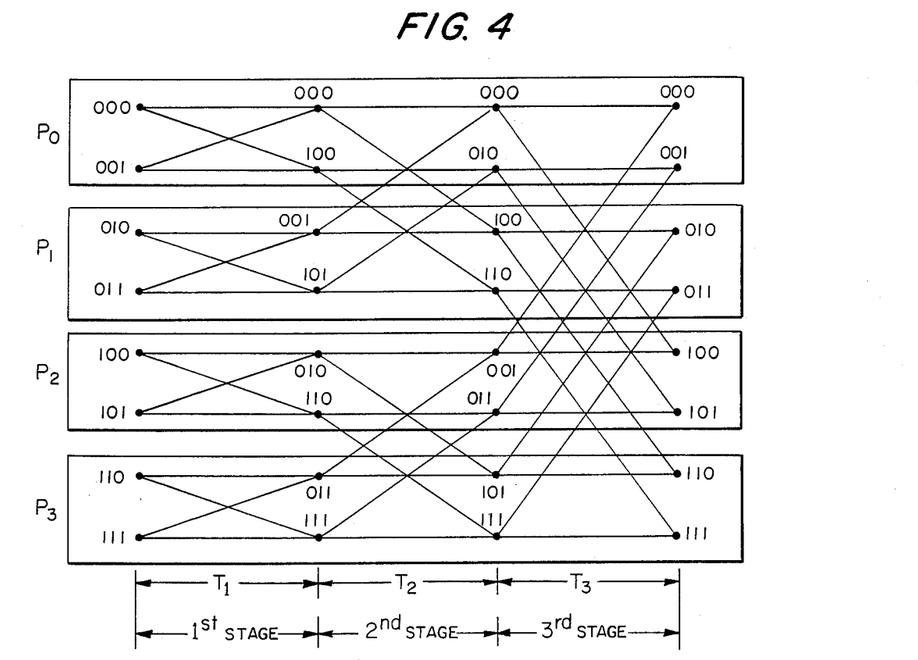
FIG. 4 is a specific decoder structure where two states are represented by each of the four processors.

When the number of states is larger than the available or feasible number of processors, it becomes necessary to assign more than one state per processor. This can be done as shown in FIG. 4, where S=2 states are assigned to each processor. The required interprocessor communication links are provided by a two-cube-connected processor system which requires two decoding operations within each state. The method and apparatus of this invention thus generalizes to a number of states per processor which is a power of two, i.e., $S=2^s$, where S is the number of states per processor.

Figure 5:
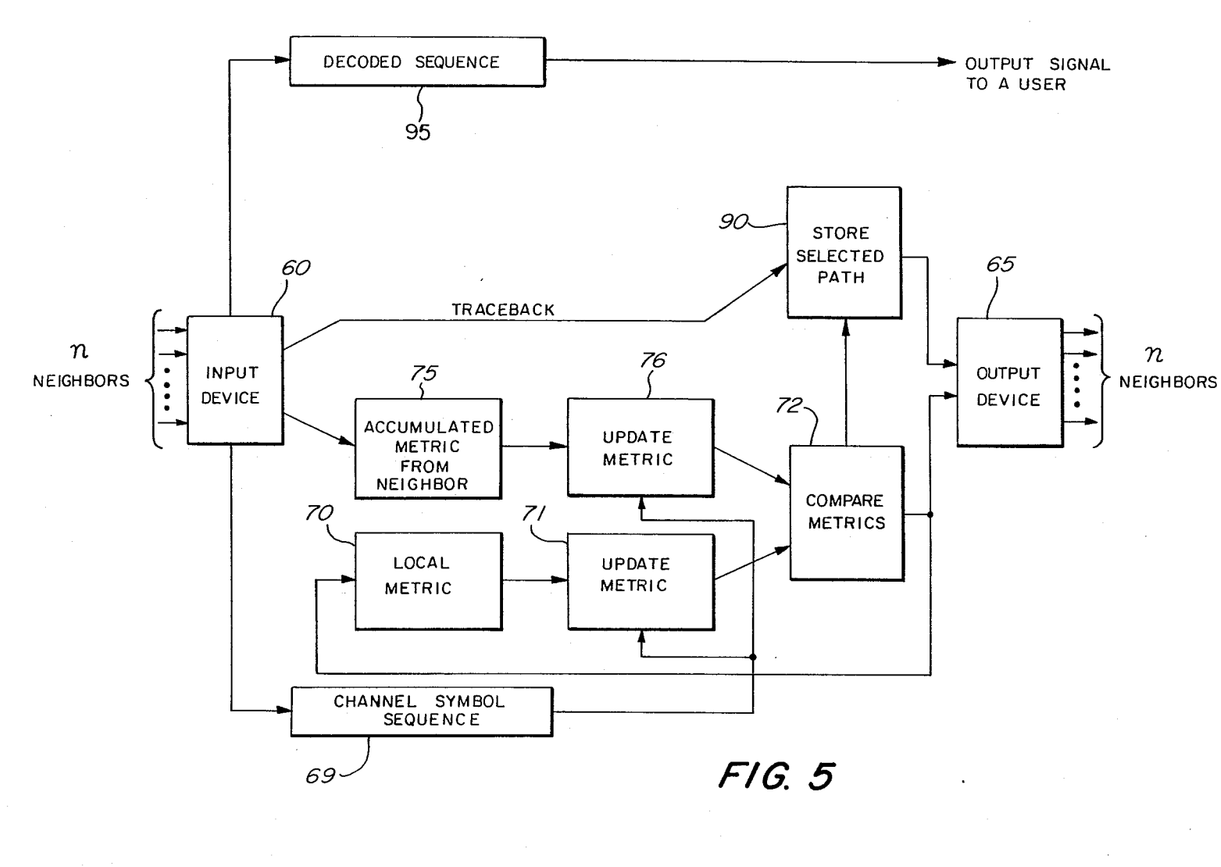
FIG. 5 is a block diagram of the internal arrangement of each processor in the network.

The simplest embodiment of the invention is shown in FIG. 5 for the case of one state per processor S=1. The block diagram of FIG. 5 represents the arrangement used in each processor of the hypercube, where the input and output devices 60 and 65 sequentially connect to neighbors along each dimension of the cube, one dimension at a time, as shown by stages 1, 2 and 3 of FIG. 3. The block diagram of FIG. 5 may be thought of as a particular means for performing the several desired functions. FIG. 5 is a timed operation which is readily performable by any well-known and available processor, and to this extent FIG. 5 may be thought of as a flow diagram for the various computations.

Although not depicted, it should be understood that all processors are initialized to the same initial state. Operation of the decoder requires that blocks of received symbols be loaded in every processor by an operation called "broadcasting." In the hypercube network of processors under consideration, data from a host processor is directly exchanged only through node zero (the origin of the cube). An efficient concurrent method is required to broadcast a message from node zero to all other nodes. Since the diameter D of an n-cube is n, a lower bound of the broadcasting time is n time units (where the unit is the time to send a message to a neighbor).

Assume that a message is in node zero, at time zero. In each subsequent time slot $t_k$ send messages in parallel from each node $$x = [x_{m-1}, \ldots, x_{k+1}, 0, x_{k-1}, \ldots, x_0]$$

to each node $$x' = [s_{m-1}, \ldots x_{k+1}, 1, x_{k-1}, \ldots, x_0],$$

the neighbors along dimension k. After n time units, the message has propagated to all nodes.

Even though this method does not minimize the number of communications (with the advantage of a very simple indexing), it optimizes the total broadcasting time to n time units, The result is clearly optimum, since it achieves the lower bound.

The decoded information is computed by the traceback method, whereby the result of each metric comparison is stored in each processor, instead of the actual information sequence. This trace-back information is performed periodically, once every block of received symbols has been processed.

This method completely eliminates the need to exchange hypothesized information sequences (survivors) among processors.

At the start of the hypercube decoding algorithm, input device 60 loads a received channel sequence to be decoded into a suitable storage device 69. As noted earlier, the preferred embodiment of this invention is achieved by VLSI techniques. Thus the storage device 69 may advantageously be an addressable storage space in the processor memory. A sequence of processor computations are then performed by the decoder. The input sequence, stored in memory 69, is used to update both a locally-store accumulated metric and an accumulated metric that has been received from a neighboring processor. The local metric is stored in a local metric memory 70. That metric value is then updated in the updated metric device 71.

Meanwhile, an accumulated metric value from a neighboring processor has been supplied by input device 60 to an accumulated metric storage 75 which is used to store the neighbor's accumulated metric value. The metric at storage 75 is updated and made available in the update metric unit 76. A suitable comparison between those updated metric values is achieved by comparator 72 and the proper metric value is retained as a new local metric value. Note that the comparator 72 supplies that new local metric value both to the local metric memory 70 and to the output device 65.

After the above described operations have been completed for a given block of data, the trace-back operation is performed. Thus, starting at any processor, the storage of selected paths in device 90 is interrogated in order to find out from which previous processor the selected path came from. A signal is sent through output device 65 to said processor, and its local storage is now interrogated, and so on. After 5m such iterations, the method continues for another full block length, but now the trace-back results are also sent through output device 65 to the decoded sequence unit 95 in the origin node, since they represent reliable decoded bits.

The decoded sequence output from storage 95 is delivered to a user. Note that input and output leads are labeled at the origin node in FIG. 3.

Figure 6A:
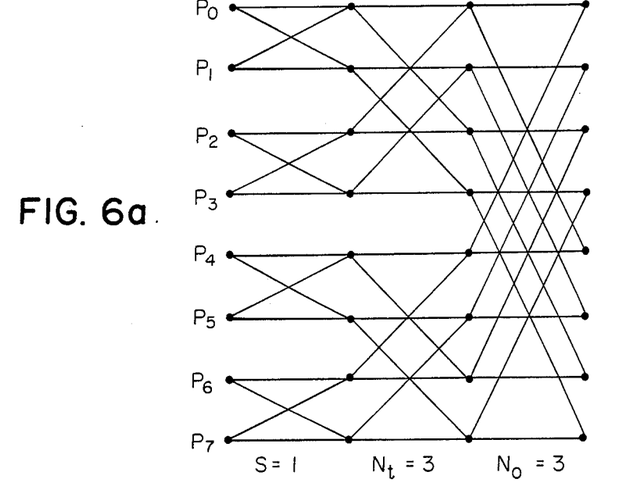
Figure 6B:
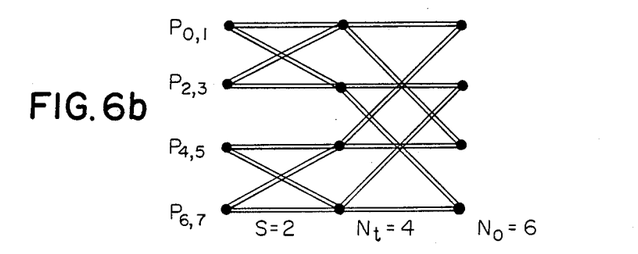
Figure 6C:
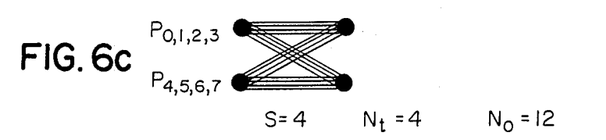

In FIG. 6a the trellis diagram is as that shown earlier in FIG. 2 and thus needs no further description. FIG. 6b describes the implementation of the same decoder of FIG. 6a, but with two states per processor (S=2). Note that double lines mean that an exchange of two metrics and two survivors along each bidirectional link between processors is required. Similarly, in FIG. 6c, each processor performs all the operations on a set of four states (S=4). Note that, when sets of $S=2^s$ states of a decoder with a total of $M=2^m$ states are combined in each processor, the trace-back takes place inside local memories for at least s stages out of m.

Figure 7A:
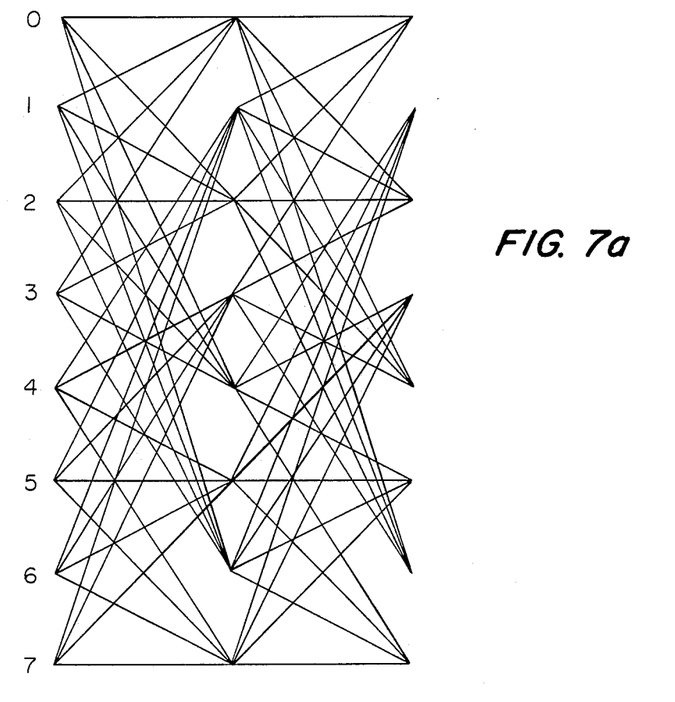
FIG. 7a is a decoder structure on a two-dimensional cube for an 8-state (m=3) code of $k_o/n_o$ where $k_o=2$.
Figure 7B:
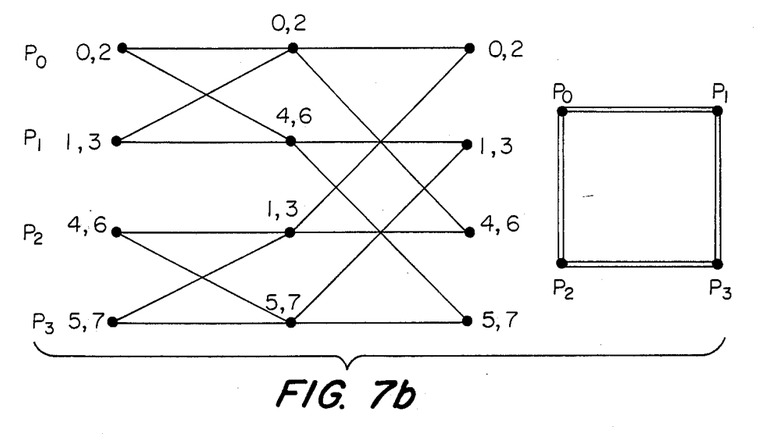
FIG. 7b is a decoder trellis for an 8-state (m=3) code of rate $k_o/n_o$, where $k_o=2$.

When more than one state is assigned to each processor, the invention can be applied to the decoding of a more general class of codes having rate $k_o/n_o$ where $k_o>1$. FIG. 7 shows a structure for decoding an 8-state code with $k_o=2$ on a two-dimensional cube with four processors. Again, all the required links in the trellis of FIG. 7a can be implemented on a 2-cube as in FIG. 7b.

Figure 8A:
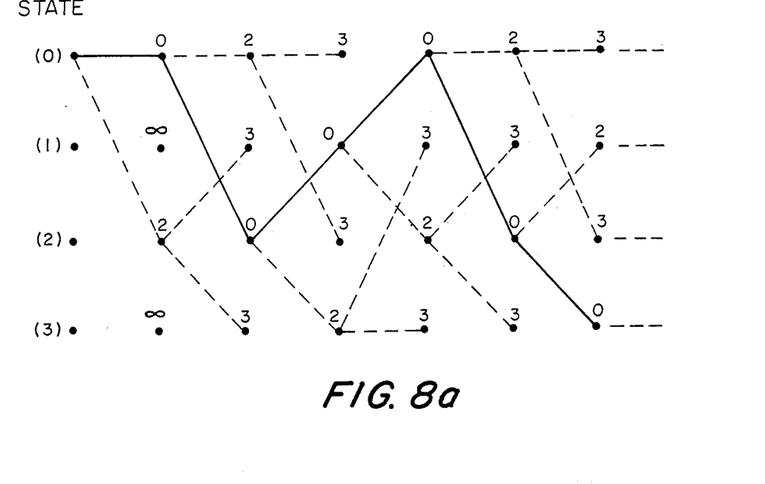
FIG. 8a is a trellis diagram of a four state decoder showing how paths are eliminated according to the usual Viterbi Algorithm.
Figure 8B:
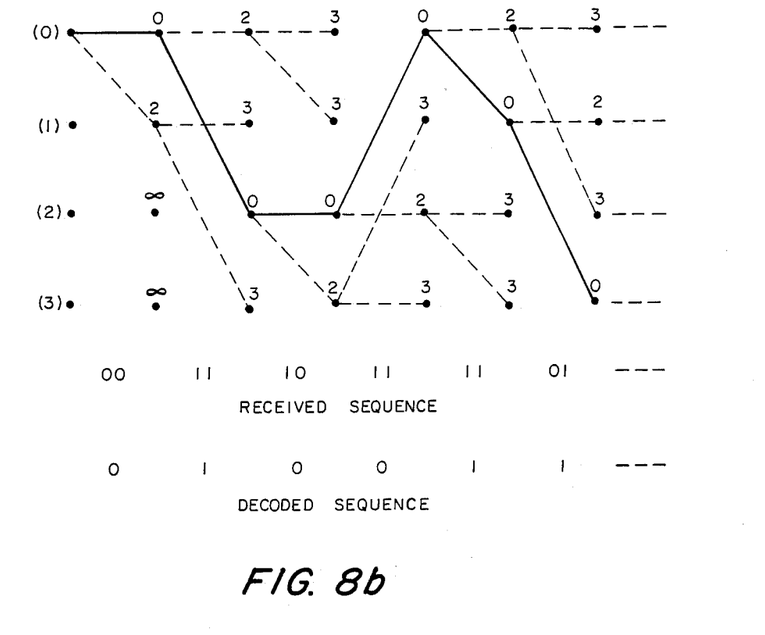
FIG. 8b a trellis diagram for four states showing how paths are eliminated during the decoding operation of this invention.

FIG. 8b is an example showing how various paths are eliminated during decoding. The solid line in FIGS. 8a and 8b is the path which has been chosen.

Consider, an an example, a decoder for a 4-state, rate one-half, convolutional code given by the generator polynomials $g_1=111$ and $g_2=101$. Such a received sequence is given in FIG. 8b.

A conventional decoder searches for the maximum-likelihood path on the graph of FIG. 8a where, for a given received sequence, all survivor paths considered are shown. The decoder of my invention operates as shown in FIG. 8b, where the same survivor paths are shown in terms of transitions between processors. The decoded sequence is obviously the same in both cases, but the transitions in FIG. 8b involve only neighboring processors on a hypercube.

Figure 9:
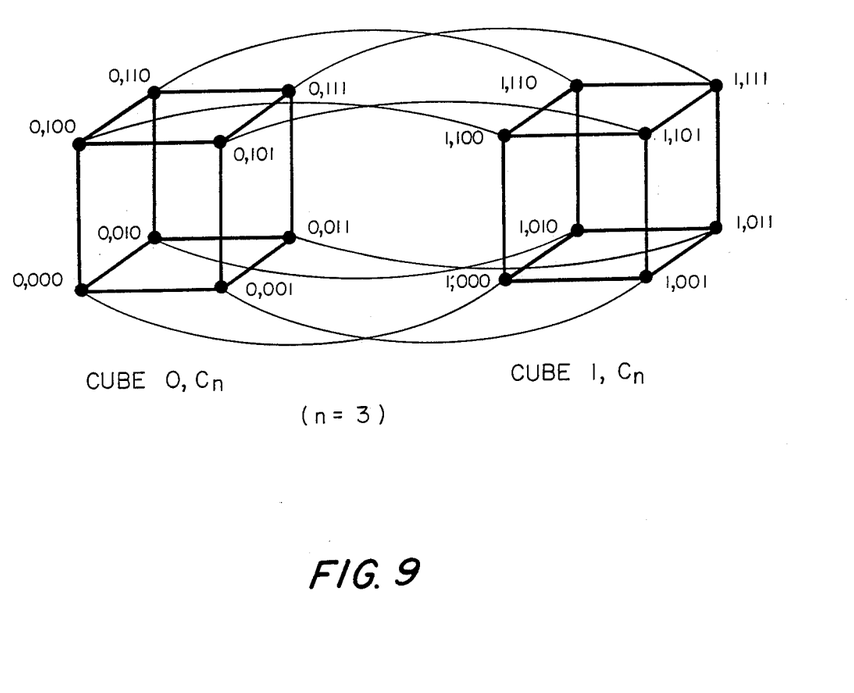
FIG. 9 is a structure for a 2M-state decoder formed by joining two M-state decoders, where each decoder is implemented on a n-dimensional cube (n=3).

FIG. 9 shows how, for $m>n$, two $2^m$-state decoders ($M=2^m$), each based on an n-cube structure, can be used to build a $2^{m+1}$-state decoder. This is done by observing that a $(n+1)$-cube $C_{n+1}$ is the union of two n-cube $O,C_n$ and $1,C_n$, such that every node $[0, x_{n-1}, \ldots, x_0]$ in $O, C_n$ is adjacent to the nodes $[1, x_{n-1}, \ldots, x_0]$ in $1,C_n$. Therefore, large decoders can be assembled from small, modular decoders on a VLSI chip, if enough spare connections are provided (one for each additional dimension). From a more theoretical point of view, this shows how my invention can merge decisions in lower-dimensional subspaces for making decisions in the full-dimensional space.

The above description presents the best mode contemplated in carrying out my invention. My invention is, however, susceptible to modifications and alternate constructions from the embodiments shown in the drawings and described above. Consequently, it is not the intention to limit the invention to the particular embodiments disclosed. On the contrary, the invention is intended and shall cover all modifications, sizes and alternate constructions falling within the spirit and scope of the invention, as expressed in the appended claims when read in light of the description and drawings.

What is claimed is:

1. A method for maximum-likelihood decoding of convolutional codes on a network of microprocessors interconnected as a hypercube in which a sequence of received symbols to be decoded is broadcast to every processor and each processor is adapted to compare the accumulated metrics and select survivors during about 5m, stages of an m-state trellis (where m is a whole integer and each processor is fixably assigned to one state of said trellis), said method comprising the steps of:
   connecting each one of a plurality of 2m processors, equipped with a decoding algorithm means, in an n-cube configuration having bidirectional communication links along the edges only of said cube and certain processors thereof not having a direct communication link between other processors of said n-cube configuration;
   mapping an equivalent trellis for said n-cube configuration wherein processors represent more than one state, and in that remapped state, have direct communication links between other processors of said n-cube configuration on said equivalent trellis;
   computing by the decoding algorithm t each processor, that processor's local accumulated metrics;
   transmitting that accumulated metric to that processor's neighboring processors as identified by said equivalent trellis;
   determining the current branch metric at each of said processors;
   updating, based on each received symbol, the locally-accumulated metrics by adding the current branch metrics thereto;
   comparing in each processor the updated locally-accumulated metrics with the updated accumulated metrics from a neighboring processor;
   locally storing the result of said comprising step in a local storage;
   tracing-back paths by interrogating local storage of each processor; and
   sending the decoded data resulting from this tracing-back step to the origin node, and then to a user.

2. A method according to claim 1, and further characterized by:
   communicating the accumulated metrics during the transmitting step only between adjacent neighboring processors, wherein each processor represents different states of the decoder at different stages on the equivalent trellis, according to the relation:

$$\hat{x}=p^{(k)}(x),$$

meaning that processor $\hat{x}$ represents states $x$ at stage k, where $p^{(k)}(.)$ is the cyclic right shift of x by k binary positions.

3. A method according to claim 1 comprising the additional step of:
   designating one processor of the n-cube network as an origin processor to receive said broadcast of said sequence of received symbols to be decoded; and
   delivering to a user, as part of said sending step, said output signal from said origin processor after said tracing-back step is concluded.

4. A method according to claim 1 comprising the additional step of:
   dividing the states of the decoding algorithm into equal parts wherein the number of states for each processor is a power of two.

5. A maximum likelihood decoding system for determining accumulated metrics and selecting survivor paths of M states of a trellis code in network of $N=2^n$ processors with each processor placed at the vertices of an n-dimensional cube and representing a set of $S=2^s$ states of the decoder formed from said processors; said decoder characterized by eliminating the need for exchanging survivors between processors in said path selection, in that:
   each processor represents different states of the trellis code at different stages on the trellis, according to the relation:

$$\hat{x}=p^{(k)}(x),$$

meaning that processor x represents state $\hat{x}$ at state k, where $\rho^{(k)}(x)$ is the cyclic right shift of x by k binary positions
   means for receiving from neighboring processors the goodness measure (accumulated metric) associated with the paths previously examined in such processor and storing the result obtained by adding the received goodness measure to the goodness measure for the current branch (branch metric); and
   means for tracing-back the most likely path based upon the results stored in said local memory.

6. A decoding system in accordance with claim 5 wherein each processor includes computing means operative with accumulated and branch metrics, as factors for said computing means at each of said processors, and said system further characterized by:
   computing means at each processor for computing that processor's locally accumulated metrics;

means in each processor updating its locally-accumulated metrics by adding thereto the branch metrics;

comparing means in each processor for comparing the local updated accumulated metrics with those accumulated branch metrics received over said links from said neighboring processor; and means for storing in a local processor memory for said trace-back means, the result from said comparing means.

7. A decoding system based on the traceback method in accordance with claim 6 and further characterized by:

means for interrogating the local memory of a processor and, according to the information there contained, to proceed to a specified other processor and so on, iteratively; and means for sending the results of said interrogating means to the origin node.

8. A decoding system in accordance with claim 5 wherein one processor from said plurality is designated as an input processor and further comprising:

input means at said input processor for receiving an encoded channel sequence to be broadcast to every one of said processors; and output means at said one processor for outputting the results of the traceback operation as a decoded output from said decoding system.

9. A method to use two above described decoders each as defined by claim 5 and, each designed for $2^m$ states, to form a $2^{m+1}$ decoder.

10. A maximum-likelihood decoding method for decoding sequence generated by a convolutional encoder having $M=2^m$ states by considering at the decoder all possible paths on a trellis of about 5m stages (where m is a whole integer) and finding the most likely path according to a specified goodness criterion, said method comprising the steps of:

forming a concurrent processor network of $N=2^n$ microprocessors interconnected as an n-dimensional cube having one microprocessor each at the vertices of said cube and bidirectional communication links for said microprocessors only along the edges of said cube;

broadcasting a sequence to be decoded to every one of said microprocessors;

assigning each of the M states to each of the N microprocessor according to the formula:

$$\hat{x} = p^{(k)}(x)$$

wherein microprocessor x represents state $\hat{x}$ at stage k and the function $p^{(k)}$ is the cyclic right shift of x by k binary positions;

computing and storing locally at each microprocessor accumulated metrics; and transmitting/receiving said computations between neighboring processors in said n-dimensional cube.

11. A maximum-likelihood decoding system for decoding accumulated metrics and tracing back paths of a M-state trellis code in a network of $N=n^2$ processors with each processor placed at the vertices of an n-directional cube and representing a set of $S=2^s$ states of the decoder formed from said processors; said decoder characterized in that:

each processor represents different states of the trellis code at different staged on the trellis, according to the relation:

$$\hat{x} = p^{(k)}(x),$$

meaning that processor x represents state $\hat{x}$ at stage k, where $p^{(k)}(x)$ is the cyclic right shift of x by k binary positions; and trace-back decoding algorithm means at each of said processors for determining accumulated metrics free from exchanging survivors between each of said processors.

12. A maximum-likelihood decoding system in accordance with claim 11 and further comprising:

bidirectional processor-communication links along the edges only of said n-dimensional cube for exchanging accumulated metrics only (i.e., eliminating the need to exchange survivors over said links).

13. A decoding system in accordance with claim 11 wherein each of said processor is characterized by means at each processor for computing its local accumulated metrics and for updating the locally-accumulated metrics by adding thereto branch metrics, and said decoding system further comprises:

comparing means in each processor for comparing the local accumulated metrics with those accumulated metrics received over said links from said neighboring processors.

14. A decoding system in accordance with claim 12 and further comprising:

an origin processor at one vertex only of said n-dimensional cube; and means for outputting to a user a decoded signal from said origin processor.

15. A method for maximum-likelihood decoding of convolutional codes for a received code sequence having $2^m$ states (where m is a whole integer) by a plurality of interconnected processors each of which is normally in communication with all the other processors of said plurality and each provided with a decoding algorithm means for deriving/interchanging decoding parameters including branch metrics, accumulated metrics and survivors in an m-state trellis with each processor fixedly assigned to one state of said trellis, the improvement comprising:

connecting each one of a plurality of $2^m$ processors, equipped with said decoding algorithm means, in an n-cube configuration having bidirectional communication links along the edges only of said cube and certain processors thereof not having a direct communication link between other processors of said n-cube configuration;

mapping an equivalent trellis for said n-cube configuration wherein processors represent more than one state and thus have direct communication links between other processors of said n-cube configuration on said equivalent trellis;

deriving/interchanging, by said decoding algorithm means, the branch and accumulated metrics between the processors while leaving the survivors in storage at each processor rather than exchanging said survivors between said processors;

representing all of the states in said equivalent trellis, and tracing back through all of said processors in said equivalent trellis accordance with said stored survivors in order to select, by said decoding algorithm means, the maximum likelihood path from said equivalent trellis for said cube system.

16. A maximum likelihood decoding system for determining accumulated metrics and selecting survivor paths during a repetitive set of stages of a trellis code having a finite number of states M, (where M is a whole integer), said system comprising:

N processors ($N=2^n$) placed at the vertices of an n-dimensional cube, where n is a whole integer, with each processor assigned to represent more than one state at different stages, K, in a repeating set of stages in the trellis code—that is—each processor x is assigned state $\hat{x}$ according to the relation:

$$\hat{x}=p^{(k)}(x),$$

meaning that processor x represents state $\hat{x}$ at stage k, where $p^{(k)}(x)$ is the cyclic right shift of x by k binary position and k is number of the stages which make up a set in the trellis;

means for comprising at each processor accumulated metrics and storing, but not exchanging between processors, survivors at said different states of the trellis code at correspondingly different stages numbered (k=0, k=1, k=2, etc.) on the trellis; and bidirectional processor-communication links along the edges of only of said n-dimensional cube for exchanging said computed accumulated metrics only between adjacent neighboring processors in order to select the proper in said n-dimensional cube.

17. A maximum-likelihood decoding method for decoding sequences generated by a convolutional encoding having $M=2^m$ states by considering at the decoder all possible paths on an n-cube trellis and finding the most likely path according to a specified goodness criterion involving decoding parameters with survivors not to be exchanged but rather to be made available for a trace-back in said path selection, said method comprising the steps of:

forming a concurrent processor network of $N=2^n$ microprocessors interconnected as an n-dimensional cube having one microprocessor each at the vertices of said cube and bidirectional communication links for said microprocessors only along the edges of said cube and corresponding to all paths to be checked on said n-cube trellis by transmitting/receiving said decoding parameters over said communicating links;

broadcasting a sequence to be decoded to every one of said microprocessors;

assigning each of the M states on said n-cube trellis to each of the N microprocessors according to the formula:

$$\hat{x}=p^{(k)}(x)$$

wherein, when expressed in binary notations, microprocessor x represents state $\hat{x}$ at stage k and the function $p^{(k)}$ is the cyclic right shift of x by k binary positions and M, m, N and n are whole integers;

computing and storing locally at each microprocessor the decoding parameters including the survivors; and transmitting/receiving said decoding parameters, exclusive of said survivors, between neighboring processors in said n-dimensional cube; and tracing back through said survivors to select the most likely path in said system.

18. A decoding method for determining the maximum-likelihood path of a trellis code having $M=2^n$ states representing a line sequence generated by a convolutional encoder and subjected to channel noise, said method involving known decoding algorithms having decoding parameters to be transmitted/received between $N(N=2^n)$ decoding processors, with M, N, and n being whole integers comprising the steps of:

dividing a decoding algorithm for said processors into equal parts as a power of two from all of said states for processing of each of said equal parts by one each of a plurality of N concurrent processors;

locating $N=2^n$ processors at the vertices of an n-dimensional cube having bidirectional communication paths for said processors only along the edges of said cube;

mapping a trellis with certain processors representing more than one state on the trellis in order to represent all of the M states on said trellis by said N processors, with each of said processors having direct transmitting/receiving paths form neighboring processors along the dimensions of said cube and in said trellis; and computing the maximum-likelihood path by a traceback through the use of non-exchanged survivors at each of said processors for each of the M states by each of the n microprocessors of said trellis wherein said processors represent more than one state in an order according to:

$$\hat{x}=p^{(k)}(x)$$

wherein microprocessor x represents a set of states $\hat{x}$ at stages k and the function $p^{(k)}$ is the cyclic right shift of x by k binary positions

* * * * *

UNITED STATES PATENT AND TRADEMARK OFFICE
CERTIFICATE OF CORRECTION

PATENT NO. : 4,868,830

DATED : September 19, 1989

INVENTOR(S) : Fabrizio Pollara-Bozzola

It is certified that error appears in the above-identified patent and that said Letters Patent is hereby corrected as shown below:

Column 2, line 58, "the parent" should read --Patent No. 4,730,322--.

Column 4, line 21, "FIG. 8b a" should read --FIG. 8b is a--.

Column 5, line 62, "yield decoding" should read --yield high decoding--.

Column 6, lines 10 and 11, delete "for the processors, the method yields".

Column 9, line 16, "n-cube" should read --n-cubes--.

Column 9, line 59, "t" should read --at--.

Column 10, line 4, "comprising" should read --comparing--.

Column 10, line 20, "$\hat{x}$" should read --x--.

Column 10, line 20, "x" should read --$\hat{x}$--.

UNITED STATES PATENT AND TRADEMARK OFFICE
CERTIFICATE OF CORRECTION

PATENT NO. : 4,868,830

DATED : September 19, 1989

INVENTOR(S) : Fabrizio Pollara-Bozzola

It is certified that error appears in the above-identified patent and that said Letters Patent is hereby corrected as shown below:

Column 11, line 67, "trellis accordance" should read --trellis in accordance--.

Column 13, line 28, "edges of only" should read --edges only--.

Signed and Sealed this

Fourth Day of December, 1990

Attest:

HARRY F. MANBECK, JR.

Attesting Officer

Commissioner of Patents and Trademarks